United States Patent [19]

Darolia et al.

[11] Patent Number: 5,215,831
[45] Date of Patent: Jun. 1, 1993

[54] DUCTILITY NI-AL INTERMETALLIC COMPOUNDS MICROALLOYED WITH IRON

[75] Inventors: Ramgopal Darolia, West Chester; David F. Lahrman, Mason; Robert D. Field, Cincinnati, all of Ohio

[73] Assignee: General Electric Company, Cincinnati, Ohio

[21] Appl. No.: 664,152

[22] Filed: Mar. 4, 1991

[51] Int. Cl.⁵ .................................................. C22C 19/03
[52] U.S. Cl. .................................. 428/614; 420/459; 148/404; 148/409; 148/429; 415/200; 416/223 R; 416/241 R
[58] Field of Search .................. 148/404, 409, 429; 420/459, 460; 428/614; 415/200; 416/223 R, 241 R

[56] References Cited

U.S. PATENT DOCUMENTS

| | | | |
|---|---|---|---|
| 2,884,688 | 5/1959 | Herz | 29/182 |
| 2,910,356 | 10/1959 | Grala et al. | 420/460 |
| 3,554,740 | 1/1971 | Williams et al. | 148/429 |
| 4,478,791 | 10/1984 | Huang et al. | 420/590 |
| 4,606,888 | 8/1986 | Huang et al. | 420/459 |
| 4,609,528 | 9/1986 | Chang et al. | 419/62 |
| 4,610,736 | 9/1986 | Barrett et al. | 148/429 |
| 4,612,165 | 9/1986 | Liu et al. | 420/459 |
| 4,613,368 | 9/1986 | Chang et al. | 75/246 |
| 4,613,480 | 9/1986 | Chang et al. | 419/30 |
| 4,668,311 | 5/1987 | Huang et al. | 148/429 |
| 4,676,829 | 6/1987 | Chang et al. | 65/246 |
| 4,710,247 | 12/1987 | Huang et al. | 148/429 |
| 4,725,322 | 2/1988 | Huang et al. | 148/429 |
| 4,731,221 | 3/1988 | Liu et al. | 420/445 |
| 4,743,315 | 5/1988 | Huang et al. | 148/429 |
| 4,743,316 | 5/1988 | Taub et al. | 148/429 |
| 4,764,226 | 8/1988 | Huang et al. | 148/429 |
| 4,915,903 | 4/1990 | Brupbacher et al. | 420/129 |
| 4,961,905 | 10/1990 | Law et al. | 148/429 |
| 5,116,438 | 5/1992 | Darolia et al. | 148/404 |

FOREIGN PATENT DOCUMENTS 2920991 11/1979 Fed. Rep. of Germany .
82/0047 2/1982 World Int. Prop. O. .

OTHER PUBLICATIONS

CA 180(26):225272p; 1986.
91(7):31–2850 Metal Alloys Abstracts; 1991.
Binary Alloy Phase Diagrams, vol. 1 ed Thaddeus Massalski pp. 140–143; 1986.
R. Henne & W. Weber; "Effects of Powder Properties on Layer Quality and Process Efficiency of Low Pressure Plasma Spraying (LPPS)-Demonstrated by Means of NiAl-(Raney Ni)-Electrode Layers for Electrolytic Hydrogen Production" Horiz. Powder Metall. Proc. Int Powder Metall Conf Exhib., vol. 1, 213–218, 1986.
Chemical Abstracts, vol. 76, No. 12, p. 313.
"Mechanical Properties of Intermetallics at High Temperatures", (ASM/TMS Materials Week, Indianapolis 1989); G. Sauthoff; ASM/TMS Symposium on Intermetallics (1989).
Rapidly Solidified Lightweight Durable Disk Material, C. C. Law and M. J. Blackburn; AFWAL-TR-8-7-4102, Dec. 1987.
Intermetallic Phases as High-Temperature Materials; G. Sauthoff, 77 Z. Metallkde 654 (1986).
Intermetallic Phases—Materials Developments and Prospects, G. Sauthoff, 80 Z. Metallkde 337 (1989).

(List continued on next page.)

Primary Examiner—R. Dean
Assistant Examiner—Margery S. Phipps
Attorney, Agent, or Firm—Carmen Santa Maria; Jerome C. Squillaro

[57] ABSTRACT

A beta phase nickel aluminide microalloyed with iron having improved ductility. Nickel aluminide intermetallics alloyed with no more than about 0.5 atomic percent iron have significantly improved room temperature ductility over conventional unalloyed beta phase nickel aluminides or beta phase nickel aluminides alloyed with higher percentages of iron.

19 Claims, 1 Drawing Sheet

OTHER PUBLICATIONS

Slip System Modification in NiAl, D. Miracle, S. Russell and C. C. Law, 133 Mat. Res. Soc. Symp. Proc. 225 (1989).

Improving the Low Temperature Ductility of NiAl, S. Guha, P. Munroe, I. Baker, 133 Mat. Res. Soc. Symp. Proc. 633 (1989).

Investigations of NiAl and Ni$_3$Al, E. Grala, *Mechanical Properties of Intermetallic Compounds*, Ed. J. H. Westbrook.

Deformation Behavior of NiAl-Based Alloys Containing Iron, Cobalt and Hafnium, D. Pank, M. Nathal, D. Koss, 133 Mat. Res. Soc. Symp. Proc. 561 (1989).

Dislocation Creep in the Ordered Intermetallic (Fe, Ni) Al Phase, M. Rudy and G. Sauthoff, 81 Materials Science and Engineering 525 (1986).

DUCTILITY NI-AL INTERMETALLIC COMPOUNDS MICROALLOYED WITH IRON

CROSS REFERENCE TO RELATED APPLICATIONS

The following commonly assigned applications are directed to related subject matter and are being concurrently filed with the present application, the disclosures of which are incorporated herein by reference: Ser. No. 664,236; Ser. No. 664,246;

This invention relates to nickel aluminide alloys for use in aircraft gas turbine engines, and more particularly to iron-containing nickel aluminide alloys for use in airfoil applications and turbine disk applications, operated at elevated temperatures in order to increase performance and efficiency.

FIELD OF THE INVENTION

The present invention relates to intermetallic compounds based on NiAl microalloyed with iron.

BACKGROUND OF THE INVENTION

There is a constant demand for improved, lightweight high temperature materials for use in gas turbine engines typically used in aircraft. Much effort has been directed to superalloys based on iron, nickel and cobalt. However, another area having a great amount of potential is that of intermetallic compounds.

Intermetallic compounds, frequently referred to simply as intermetallics, are compounds of metals having particular crystal structures which are different from those of the component metals. Intermetallics have ordered atom distribution. Although the bonding of intermetallics is still predominantly metallic bonding, making them less brittle than ceramics, they still tend to be brittle at ambient temperature. These ordered structures exist over specific composition ranges, exhibit high melting points and have the potential for good strength, despite low ductilities or fracture toughnesses at ambient temperature. Typical intermetallics include TiAl, Ti$_3$Al, Ni$_3$Al and NiAl.

The NiAl system is of particular interest. It is particularly attractive for use as a turbine airfoil. These airfoils typically are made from nickel base superalloys. However, NiAl intermetallics offer reduced density, up to 33% lower, and higher thermal conductivity, up to 300%, as compared to nickel base superalloys. However, the low ductility of NiAl intermetallics, less than 1% between room temperature and about 600° F., has impeded the implementation of NiAl intermetallics as a viable substitute for nickel base alloys.

Although many investigations have been directed to improvements and refinements in Ni$_3$Al, investigations into improvements in NiAl have been somewhat limited. For example, Liu et al., in U.S. Pat. Nos. 4,612,165 and 4,731,221, have investigated ductility improvements in Ni$_3$Al having less than 24.5% by weight of aluminum by additions of effective amounts of boron plus additions of 0.35 to 1.5% of hafnium, zirconium, iron and combinations thereof. Similarly, Huang et al., in U.S. Pat. No. 4,478,791, explored improvements in the ductility of Ni$_3$Al intermetallics by additions of small amounts of boron.

The NiAl intermetallic system has also been studied. Most work has been directed to improving ambient temperature ductility of NiAl. Law et al., in U.S. Pat. No. 4,961,905 have investigated improvements in the ductility and toughness of the intermetallic at low temperatures by adding at least 10 at. % cobalt in order to cause the formation of the Ll$_0$ martensitic phase. Rudy and Sauthoff, in their paper, "Creep Behaviour of the Ordered Intermetallic (Fe,Ni)Al Phase", Mat. Res. Soc. Symp. Proc., Vol. 39 (1985), discuss creep behavior of NiAl intermetallics containing at least 10 at. % iron, and conclude that the creep resistance of these brittle alloys is at a maximum at 10 at. % iron.

Barrett et al., U.S. Patent No. 4,610,736, added small amounts of zirconium, 0.05% to 0.25% by weight, to NiAl to improve the cyclic oxidation resistance of NiAl as a coating. Grala et al. report in "Investigations of NiAl and Ni$_3$Al", *Mechanical Properties of Intermetallic Compounds*, (1960), that additions of 0.5% by weight molybdenum resulted in a heavy grain boundary precipitate, but lowered the brittle-ductile transition temperature of NiAl to room temperature, thereby improving ductility to about 1.9%.

It would be desirable if intermetallic compounds could be alloyed in a manner so as to improve the room temperature ductility of NiAl intermetallics, while maintaining the ordered atomic structure of the intermetallic, which contributes to such desirable characteristics as high temperature tensile strength, high melting point and excellent thermal conductivity.

SUMMARY

The alloy of the present invention is an iron-containing NiAl nickel aluminide alloy. The alloy is a beta phase intermetallic, and iron is included as microalloying additions in a NiAl intermetallic having about equiatomic amounts of aluminum and nickel. At room temperature, NiAl, containing from about 45 at. % to about 59 at. % Ni, forms a single phase intermetallic, referred to as the beta phase. This phase field exists, up to its melting point, about 2950° F.–3000° F., although the compositional limits of the nickel and aluminum will vary slightly with temperature. In its broadest embodiment, the alloy of the present invention consists essentially of, in atomic percent, about 48% to about 57% nickel, about 0.01% to about 0.5% iron and the balance essentially aluminum. The nickel content is preferably about 50 at. % to about 53 at. % nickel, while the iron content of the alloy is included in an amount of from about 0.01% to about 0.5%, preferably from about 0.05 at. % to about 0.25 at. %, with the balance being essentially aluminum. A microalloyed iron-containing NiAl of the present invention displays improved ductility and plastic strain.

An advantage of the present invention is significantly improved room temperature ductility over conventional NiAl alloys not containing these microadditions of iron, or having iron present in atomic percentages greater than that contemplated by the present invention.

Another advantage of the alloy of the present invention is that it has a low density, about 0.210 lbs/in$^3$ making it very suitable for use as an airfoil or as a turbine disk in a turbine engine due to the significant decrease in density over current alloys.

Other advantages include excellent oxidation resistance and a simple ordered crystal structure, the crystal structure being a body-centered cubic crystal structure of the CsCl type, having potentially easier plastic deformation as compared to other intermetallic compounds. Oxidation resistance may be further increased by the addition of small amounts of zirconium, for example, 0.1 at. %.

The term "balance essentially aluminum" as used herein, includes in addition to aluminum in the balance of the alloy, small amounts of impurities and incidental elements, which in character and/or amount do not adversely affect the advantageous aspects of the alloy. These impurities are generally present in amounts less than 100 ppm each. Typical impurities include carbon, from 15 to 60 ppm; oxygen, from 40 to 100 ppm; sulphur, from about 1 to about 2 ppm; boron, from about 5 to about 6 ppm; and nitrogen, from about 1 to about 3 ppm. Other impurities may include silicon, copper and cobalt.

As used herein, yield strength ("Y.S.") is the 0.2% offset yield strength corresponding to the stress required to produce a plastic strain of 0.2% in a tensile specimen that is tested in accordance with ASTM Specification E8 ("Standard Methods of Tension Testing of Metallic Materials," Annual Book of ASTM Standards, Vol. 03.01, pp. 130-150, 1984) or equivalent method. The term ksi represents a unit of stress equal to 1,000 pounds per square inch. Plastic strain is defined as inelastic strain prior to failure in tension at room temperature when tested in accordance with ASTM Specification E8.

The intermetallics of the present invention may be processed by any suitable single crystal growth method that does not result in excessive impurities, which would otherwise affect the mechanical properties. The intermetallics of the present invention may be used to fabricate airfoils for use in gas turbine engines. These airfoils include both rotating compressor blades and turbine blades mounted on turbine disks as well as static vanes.

Other features and advantages of the present invention will be apparent from the following more detailed description of the preferred embodiment, taken in conjunction with the accompanying drawing, which illustrate the principles of the invention.

DETAILED DESCRIPTION OF THE INVENTION

Figure 1:
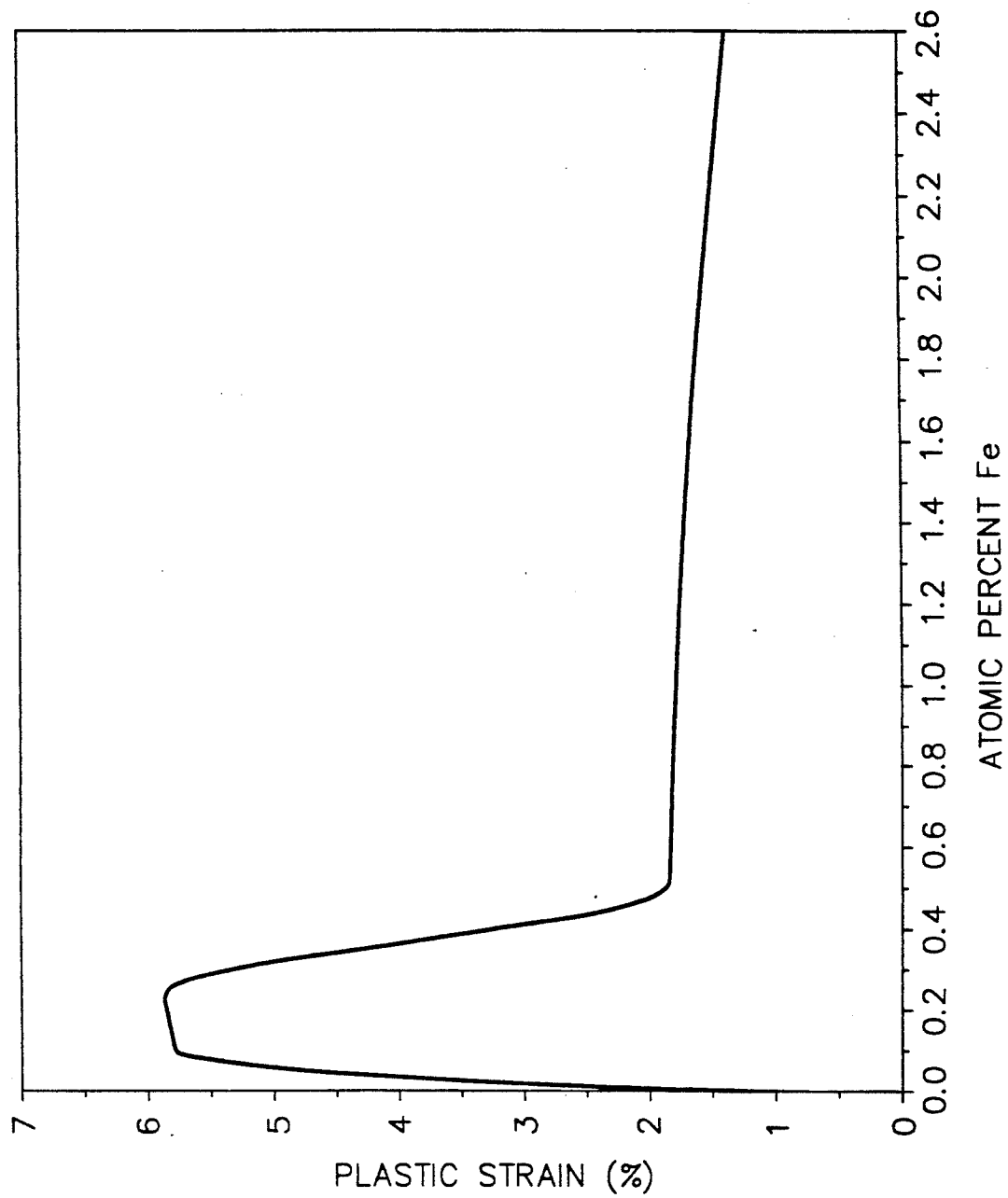
FIG. 1 is a plot of percent of plastic strain versus atomic percent iron in the NiAl intermetallic.

Pursuant to the present invention, beta phase NiAl intermetallics microalloyed with iron which have improved room temperature ductility are disclosed. The preferred beta phase intermetallics are single crystals which include at least about 50 atomic percent nickel and about 0.01 atomic percent to about 0.5 atomic percent iron. These beta phase intermetallics, and single crystal articles grown from such intermetallics, have a room temperature plastic strain of at least about 1.8%.

One of the potential applications of the intermetallic of the present invention is as an airfoil. The advantages of NiAl include low density. The NiAl intermetallic of the present invention has a density of 0.210 lbs/in$^3$. This density is about two thirds of the density of current nickel base superalloys. This lower density results in a lighter part. For example, when the airfoil is a rotating turbine blade, not only is the weight of the turbine blade reduced by the use of a NiAl intermetallic, but the weight of the turbine disk is also reduced due to the lower stresses on the disk.

The thermal conductivity of the NiAl of the present invention also represents an improvement over the thermal conductivity of superalloys currently employed. This property is important when the part is used at elevated temperatures, for example, as a high pressure turbine blade. The improved thermal conductivity permits better heat distribution and eliminates potential life limiting hot spots.

The beta phase nickel aluminide intermetallic of the present invention is a simple ordered structure based on the body centered cubic (bcc) structure, with nickel located at the corners, and aluminum located at the body-centered site. For the intermetallics of the present invention, iron generally has been substituted for aluminum. Thus, for stoichiometric NiAl, it is believed that the substitution of iron for aluminum results in the replacement of Al in the structure.

The alloys of the present invention were produced by combining high purity elemental material in the appropriate amounts and by induction melting under an argon atmosphere. The induction melted charge is then remelted in a directional solidification furnace under an argon atmosphere to prevent the vaporization of Al, and solidified as single crystals using the well-known Bridgman Withdrawal Process, although any other single crystal growth process may be used.

Impurities were maintained at low levels, measured in parts per million ("ppm"), so that their presence may be characterized as trace. These trace elements were generally interstitial elements such as oxygen, nitrogen, carbon, sulphur and boron, and are present in amounts of less than 100 ppm by weight of each impurity. Silicon is present up to as high as 1000 ppm.

A preferred embodiment of the single crystal nickel aluminide of the present invention consists essentially of about 50 at. % to about 53 at. % Ni, about 0.01 at. % to about 0.5 at. % iron and the balance essentially aluminum. Optionally, for maximum ductility, the iron level is maintained in the range of from 0.05 at. % to about 0.25 at. %

In a most preferred embodiment, the single crystal nickel aluminide of the present invention consists essentially of, in atomic percent, about 50% to about 51% nickel, about 0.05% to about 0.25% iron and the balance essentially aluminum. Single crystal articles having this preferred composition are expected to have the best ductility, exhibiting a room temperature plastic strain of at least about 5% in tension.

Single crystal intermetallic NiAl alloys microalloyed with iron prepared in accordance with the present invention unexpectedly display unusually high room temperature plastic strain in the <110> orientation below an iron content, in atomic percent, of about 0.5%. A plot of the plastic strain to fracture vs. iron level is shown in FIG. 1. Below about 0.5%, the room temperature plastic elongation rises rapidly to about 6%. At about 0.5% iron, the plastic strain falls to an acceptable level, about 1.8%, and gradually decreases with increasing iron content, with the plastic strain of 1.4% at an iron content of about 2.5 at. %.

The compositions of the intermetallic NiAl compounds of the present invention, as well as other NiAl compounds are provided in Table I below, by way of illustration. The corresponding mechanical properties of each of the alloys are provided in Table II below, which are obtained by testing the compositions of Table I in tension such that the <110> crystallographic direction was aligned parallel to the stress axis of the test specimen.

TABLE I

| Alloy[1] | Chemical Compositions | | |
|---|---|---|---|
| | Ni | Al | Fe |
| D133 | 50.00 | 40.00 | 10.00 |
| D132 | 50.00 | 45.00 | 5.00 |
| D62 | 50.02 | 47.48 | 2.50 |
| D131 | 50.00 | 48.75 | 1.25 |
| D181 | 50.00 | 49.50 | 0.50 |
| D182 | 50.00 | 49.75 | 0.25 |
| D183 | 50.00 | 49.90 | 0.10 |
| D5 | 50.00 | 50.00 | 0.00 |
| D18 | 45.00 | 50.00 | 5.00 |
| D19 | 40.00 | 50.00 | 10.00 |
| D20 | 30.00 | 50.00 | 20.00 |

Note [1]Compositions are in atomic percent

TABLE II

| Alloy | Mechanical Properties[1, 2] | | |
|---|---|---|---|
| | UTS | 0.2% YS | Plastic Strain |
| D133 | 50.58 | 49.63 | 0.47% |
| D132 | 77.92 | 77.08 | 0.40% |
| D62 | 42.05 | 36.58 | 1.40% |
| D131 | 34.78 | 28.40 | 1.72% |
| D181 | 43.99 | 38.92 | 1.84% |
| D182 | 43.15 | 25.59 | 5.86% |
| D183 | 43.44 | 26.99 | 5.19% |
| D5 | 31.27 | 28.58 | 0.86% |
| D18 | 72.19 | 71.30 | 0.27% |
| D19 | | | Too brittle to machine |
| D20 | | | Too brittle to machine |

Note [1]Room Temperature Test Results
Note [2]Stresses are in units of ksi

In addition to improved ductility, the fracture toughness of the intermetallics of the present invention also improves. The fracture toughness is also anisotropic, and also increases with increasing temperature due to increased plasticity at the tip of the growing crack.

The improved room temperature ductility of the NiAl intermetallics microalloyed with iron of the present invention, particularly in the preferred and most preferred compositional ranges, make them attractive substitutes for nickel base superalloys in articles such as disks, ductile matrices for reinforced intermetallic composites, in polycrystalline form, and single crystal airfoils for turbine applications.

In light of the foregoing discussion, it will be apparent to those skilled in the art that the present invention is not limited to the embodiments and compositions herein described. Numerous modifications, changes, substitutions and equivalents will now become apparent to those skilled in the art, all of which fall within the scope contemplated by the invention herein.

What is claimed is:

1. A beta phase nickel aluminide intermetallic comprising, in atomic percent, at least about 50% nickel and about 0.01% to about 0.5% iron.

2. A beta phase nickel aluminide alloy consisting essentially of, in atomic percent, about 48% to about 57% nickel, about 0.01% to about 0.5% iron and the balance essentially aluminum.

3. A beta phase nickel aluminide alloy consisting essentially of, in atomic percent, about 50% to about 53% nickel, about 0.01% to about 0.5% iron and the balance essentially aluminum.

4. The nickel aluminide alloy of claim 3 wherein the atomic percent of iron is about 0.05% to about 0.25%.

5. A single crystal beta phase nickel aluminide alloy consisting essentially of, in atomic percent, about 50% to about 53% nickel, about 0.01% to about 0.5% iron and the balance essentially aluminum.

6. The single crystal nickel aluminide alloy of claim 5 wherein the atomic percent of iron is about 0.05% to about 0.25%.

7. A single crystal beta phase nickel aluminide alloy consisting essentially of, in atomic percent, about 50% to about 51% nickel, about 0.05% to about 0.25% iron and the balance essentially aluminum.

8. A beta phase nickel aluminide article consisting essentially of, in atomic percent, about 50% to about 53% nickel, about 0.01% to about 0.5% iron and the balance essentially aluminum.

9. The article of claim 8 wherein the article is a turbine disk.

10. A reinforced intermetallic matrix composite article comprising fiber within an intermetallic matrix, the intermetallic matrix consisting essentially of, in atomic percent, about 50% to about 53% nickel, about 0.01% to about 0.5% iron and the balance essentially aluminum, and characterized by a room temperature plastic strain of at least about 1.8%.

11. A single crystal beta phase nickel aluminide article consisting essentially of, in atomic percent, about 50% to about 53% nickel, about 0.01% to about 0.5% iron and the balance essentially aluminum.

12. The article of claim 11 wherein the article is an airfoil.

13. The article of claim 11 wherein the atomic percent of iron is about 0.05% to about 0.25%.

14. The article of claim 13 wherein the article is an airfoil.

15. A single crystal beta phase nickel aluminide article consisting essentially of, in atomic percent, about 50% to about 51% nickel, about 0.05% to about 0.25% iron and the balance essentially aluminum.

16. The article of claim 15 wherein the article is an airfoil.

17. The article of claim 15 wherein the article is further characterized by having room temperature plastic strain of at least about 5% in tension.

18. A single crystal beta phase NiAl intermetallic comprising, in atomic percent, at least about 0.01% to about 0.5% iron, and further characterized by a room temperature plastic strain of at least about 1.8%.

19. A single crystal beta phase NiAl intermetallic article having the composition of claim 18.

* * * * *